(12) United States Patent
Goel et al.

(10) Patent No.: US 8,462,562 B1
(45) Date of Patent: Jun. 11, 2013

(54) MEMORY DEVICE WITH AREA EFFICIENT POWER GATING CIRCUITRY

(75) Inventors: Ankur Goel, Haryana (IN); Donald Albert Evans, Carroll, OH (US); Dennis Edward Dudeck, Hazle Township, PA (US); Richard John Stephani, Saint Paul, MN (US); Ronald James Wozniak, Whitehall, PA (US); Dharmendra Kumar Rai, Uttar Predish (IN); Rasoju Veerabadra Chary, Karnataka (IN); Jeffrey Charles Herbert, Narareth, PA (US)

(73) Assignee: LSI Corporation, San Jose, CA (US)

( * ) Notice: Subject to any disclaimer, the term of this patent is extended or adjusted under 35 U.S.C. 154(b) by 104 days.

(21) Appl. No.: 13/300,180

(22) Filed: Nov. 18, 2011

(51) Int. Cl.
*G11C 7/20* (2006.01)
(52) U.S. Cl.
USPC ....... 365/189.06; 365/154; 365/226; 365/229
(58) Field of Classification Search
None
See application file for complete search history.

(56) References Cited

U.S. PATENT DOCUMENTS

| | | | |
|---|---|---|---|
| 7,079,426 B2 | | 7/2006 | Zhang et al. |
| 7,342,845 B2 * | | 3/2008 | Somasekhar et al. ......... 365/229 |
| 7,362,646 B2 | | 4/2008 | Otsuka et al. |
| 8,427,886 B2 * | | 4/2013 | Goel et al. ............... 365/189.06 |
| 2011/0007596 A1 | | 1/2011 | Lee et al. |

OTHER PUBLICATIONS

A. Nourivand et al, "An Adaptive Sleep Transistor Biasing Scheme for Low Leakage SRAM," Dept. of Electrical and Computer Engineering, Concordia University, Montreal, Quebec, Canada.
A. Goel et al., "Gate Leakage and Its Reduction in Deep Submicron SRAM," Proceeding of the 18th International Conference on VLSI Design, 2005, IEEE.
K. Zhang et al., "Low-Power SRAMs in Nanoscale CMOS Technologies," IEEE Transactions on Electron devices, Jan. 2008, pp. 145-151, vol. 55, No. 1, IEEE, Lausanne, Switzerland.

* cited by examiner

*Primary Examiner* — Tan T. Nguyen
(74) *Attorney, Agent, or Firm* — Otterstedt, Ellenbogen & Kammer, LLP

(57) ABSTRACT

A memory device comprises a memory block, a power gating transistor, and control circuitry. The memory block includes at least one memory cell comprising a storage element electrically connected to a source potential line, a drive strength of the storage element being a function of a voltage level on the source potential line. The power gating transistor, in turn, is connected between the source potential line and a voltage source. The control circuitry is operative to configure the power gating transistor to electrically connect the source potential line to the voltage source while the memory block is in a first mode, and to clamp the source potential line at a voltage different from that of the voltage source when the memory block is in a second mode.

20 Claims, 4 Drawing Sheets

US 8,462,562 B1

MEMORY DEVICE WITH AREA EFFICIENT POWER GATING CIRCUITRY

BACKGROUND

The electrical current required to maintain data integrity in static random-access memories (SRAMs) has dramatically increased as the cell size has been reduced. The dominant leakage mechanisms in a modern complementary metal-oxide-semiconductor (CMOS) six-transistor (6T) SRAM cell are transistor gate leakage and sub-threshold leakage. In the last several years, gate leakage has been controlled to some extent through the use of high-dielectric-constant (HIGH-K) metal gates. Sub-threshold leakage, on the other hand, is still a challenge for low power SRAMs.

SUMMARY

Embodiments of the invention provide memory devices with power gating capabilities. To accomplish this, embodiments of the invention utilize a power gating circuit that is electrically connected to source terminals of memory cells within a memory block. The power gating circuit sets the source potential low (e.g., ground potential or VSS) when the memory block is in an active mode, and sets the source potential to a value higher than ground (e.g., VSSC) when that memory block is in a standby mode. The resultant power gating of the memory cells reduces their standby leakage currents and thereby reduces the standby leakage of the entire memory device. The use of a single power gating transistor and just a few associated control transistors allows the power gating circuit to be implemented in a very area efficient manner. Moreover, an additional shutdown mode with even lower leakage current is available with little added overhead.

In accordance with an embodiment of the invention, a memory device comprises a memory block, a power gating transistor, and control circuitry. The memory block includes at least one memory cell comprising a storage element electrically connected to a source potential line, a drive strength of the storage element being a function of a voltage level on the source potential line. The power gating transistor, in turn, is connected between the source potential line and a voltage source. Lastly, the control circuitry is operative to configure the power gating transistor to electrically tie the source potential line to the voltage source while the memory block is in a first mode, and to clamp the source potential line at a voltage different from that of the voltage source when the memory block is in a second mode.

In accordance with another embodiment of the invention, a power gating circuit is adapted for use with a memory block, the memory block including at least one memory cell comprising a storage element electrically connected to a source potential line, a drive strength of the storage element being a function of a voltage level on the source potential line. The power gating circuit comprises a power gating transistor and control circuitry. The power gating transistor is connected between the source potential line and a voltage source. The control circuitry is operative to configure the power gating transistor to electrically connect the source potential line to the voltage source while the memory block is in a first mode, and to clamp the source potential line at a voltage different from that of the voltage source when the memory block is in a second mode.

In accordance with yet another embodiment of the invention, an integrated circuit comprises at least one memory device. The memory device, in turn, comprises a memory block, a power gating transistor, and control circuitry. The memory block includes at least one memory cell comprising a storage element electrically connected to a source potential line, a drive strength of the storage element being a function of a voltage level on the source potential line. The power gating transistor is connected between the source potential line and a voltage source. The control circuitry is operative to configure the power gating transistor to electrically connect the source potential line to the voltage source while the memory block is in a first mode, and to clamp the source potential line at a voltage different from that of the voltage source when the memory block is in a second mode.

Embodiments of the present invention will become apparent from the following description of embodiments thereof, which are to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DESCRIPTION OF EMBODIMENTS

Embodiments of the invention will be described herein in the context of illustrative memory devices having power gating circuitry. It should be understood, however, that embodiments falling within the scope of the appended claims are not limited to these or any other particular circuit arrangements. It will become apparent to those skilled in the art, given the teachings herein, that numerous modifications can be made to the embodiments shown that are within the scope of the claimed invention. That is, no limitations with respect to the specific embodiments described herein are intended or should be inferred.

For the purpose of describing and claiming embodiments of the invention, the term MISFET as used herein is intended to be construed broadly and to encompass any type of metal-insulator-semiconductor field effect transistor. The term MISFET is, for example, intended to encompass semiconductor field effect transistors that utilize an oxide material as their gate dielectric (i.e., metal-oxide-semiconductor field effect transistors (MOSFETs)), as well as those that do not. In addition, despite a reference to the term "metal" in the acronym MISFET, the term MISFET is also intended to encompass semiconductor field effect transistors wherein the gate is formed from a non-metal such as, for instance, polysilicon.

Although embodiments of the invention described herein may be implemented using p-channel MISFETs (hereinafter called "PFETs") and n-channel MISFETs (hereinafter called "NFETs"), as may be formed using a CMOS fabrication process, it is to be appreciated that embodiments of the invention are not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be understood by those skilled in the art. Moreover, although embodiments of the invention are typically fabricated in a silicon wafer, embodiments of the invention can alternatively be fabricated in wafers comprising other materials, including but not limited to gallium arsenide (GaAs), indium phosphide (InP), etc.

Figure 1:
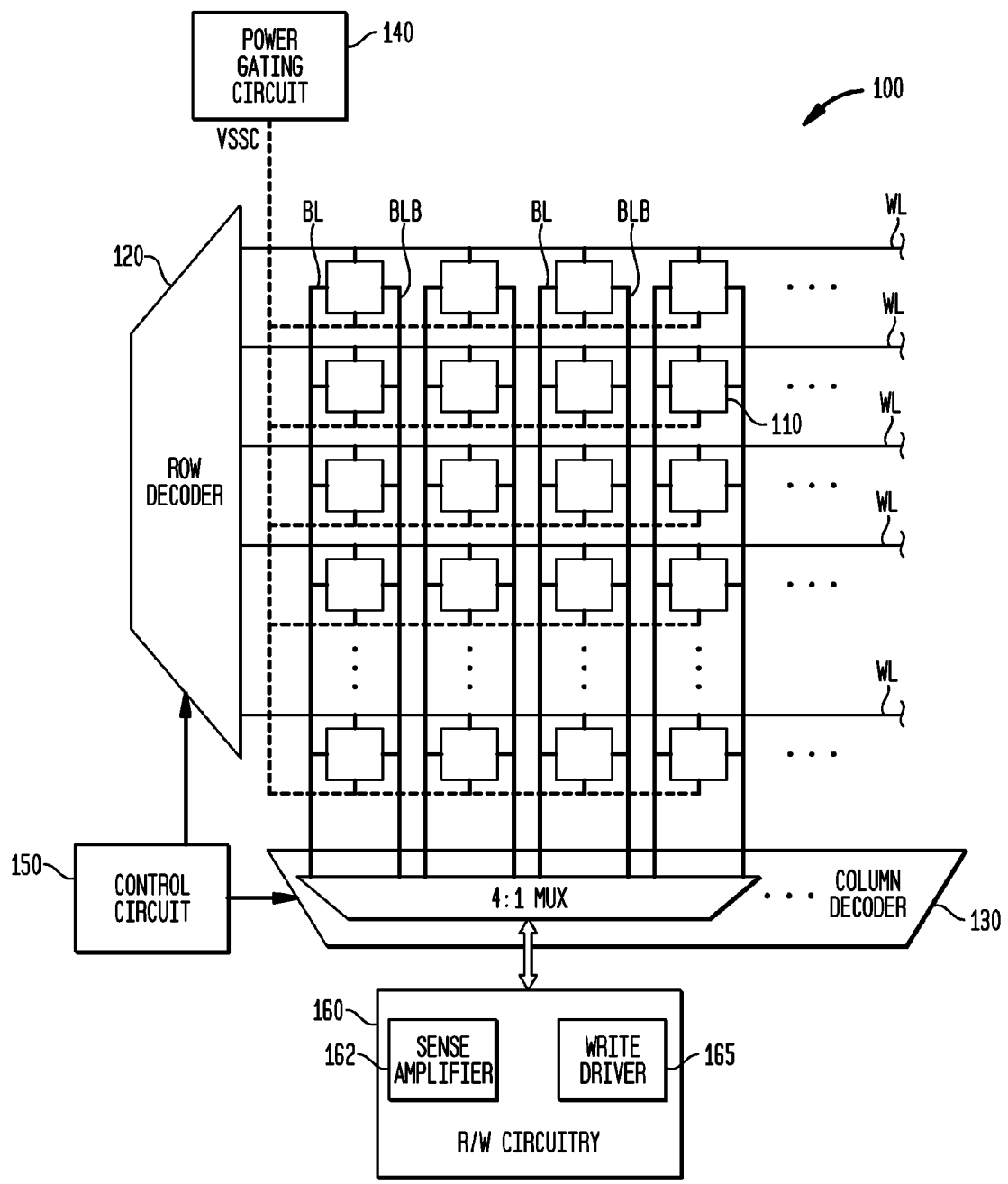
FIG. 1 shows a block diagram of at least a portion of an illustrative memory block in an SRAM device, according to an embodiment of the invention.

FIG. 1 shows a block diagram of an illustrative memory block 100 according to an embodiment of the invention. In this example, the memory block 100 is only one of several such blocks forming a larger memory device, in this particular case, an SRAM device. The memory block 100 comprises a memory cell array and several peripheral circuits. More particularly, the memory cell array includes a plurality of memory cells 110 arranged in a grid, although such a configuration is not limiting. The peripheral circuits include a row decoder 120, a column decoder 130, a power gating circuit 140, a control circuit 150, and read/write (r/w) circuitry 160. The r/w circuitry 160 comprises a sense amplifier 162 for reading data stored in one or more of the memory cells 110 and a write driver 165 for writing data to one or more of the memory cells 110. A plurality of word lines WL extend in the row direction of the memory block 100 and are coupled with row decoder 120, while a plurality of bit lines BL and BLB extend in the column direction and are coupled with column decoder 130. Bit lines BL and BLB are logical complements of one another. Each memory cell 110 is connected to a unique combination of one word line WL and one pair of complementary bit lines BL and BLB. Each memory cell 110 is also connected to the power gating circuit 140, shown as dotted connections in the figure. Control circuit 150 is coupled with the row and column decoders 120 and 130, respectively.

Figure 2:
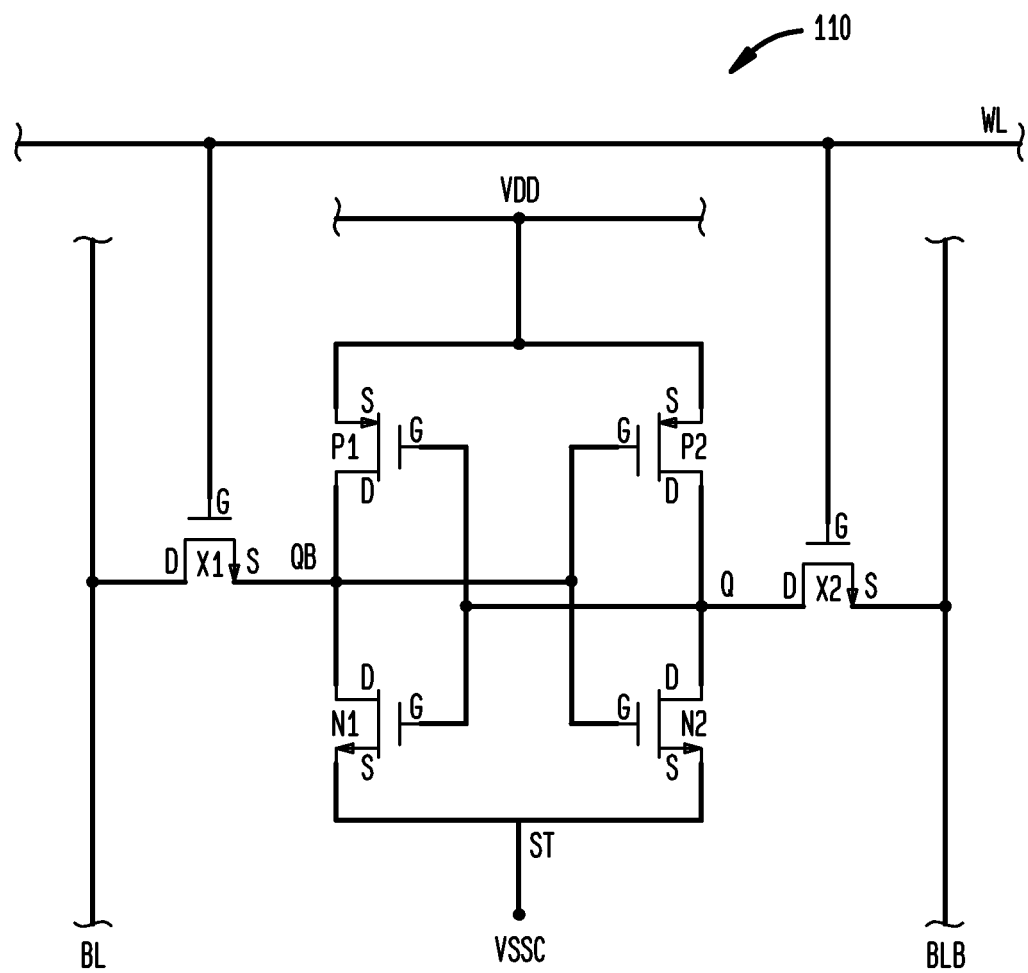
FIG. 2 shows a schematic diagram of at least a portion of an illustrative memory cell that may reside within the FIG. 1 memory block, according to an embodiment of the invention.

FIG. 2 shows a schematic diagram of at least a portion of an illustrative memory cell 110 that may reside within the FIG. 1 memory block 100, according to an embodiment of the invention. In this particular embodiment, the memory cell 110 includes two cross-coupled inverters, which are operative as a storage element of the memory cell 110. A first inverter includes a PFET P1 and an NFET N1. A source terminal (S) of the PFET P1 is adapted for connection to a power supply source, which is VDD in this embodiment. A drain terminal (D) of PFET P1, on the other hand, is connected to a drain terminal of the NFET N1 via a memory node QB. Finally, a source terminal of the NFET N1 is connected to a source terminal node ST, which, in turn, is connected to the power gating circuit 140 (FIG. 1) and is at source potential VSSC.

In a similar manner, a second inverter in the illustrative memory cell 110 in FIG. 2 includes a PFET P2 and an NFET N2. Here, a source terminal of the PFET P2 is adapted for connection to the power supply source VDD, while a drain terminal of the PFET P2 is connected to a drain terminal of the NFET N2 via a memory node Q. Lastly, a source terminal of the NFET N2 is also connected to the source terminal node ST at source potential VSSC.

In order to cross-couple the two inverters, gate terminals (G) of the PFET P1 and the NFET N1 are connected to the memory node Q, and gate terminals of the PFET P2 and the NFET N2 are connected to the memory node QB. In this manner, the output of the first inverter is connected to the input of the second inverter, while the output of the second inverter is connected to the input of the first inverter. Cross coupling inverters allows the memory cell 110 to act as a latch (i.e., flip-flop) with the ability to store complementary logic states at memory nodes Q and QB. In the present embodiment, the memory cell 110 is therefore of the static type. Between read and write operations, the inverters reinforce each other and maintain the voltage levels on Q and QB so long as the inverters are connected to the power supply source VDD.

In the present embodiment, the respective source terminal nodes ST of the memory cells 110 are set at ground potential VSS when writing data to and reading data from the memory cells 110. Once so set, access (e.g., reading and/or writing data) to the memory cells 110 may, to a large degree, be regulated by transfer NFETs X1 and X2, also visible in FIG. 2, or by alternative switch elements (e.g., pass gates, etc.). Transfer NFETs X1 and X2 are coupled with the first and second inventors, respectively, and are operative to connect the first and second inverters to the corresponding bit lines BL and BLB, respectively, as a function of control signals supplied to gate terminals of X1 and X2. The gate terminals of the NFET X1 and the NFET X2 are connected to a corresponding word line WL.

To write data to the memory cell 110, the bit lines BL and BLB are chosen by the column decoder 130 and are pre-charged by the write driver 165 (FIG. 1) to a state representative of the logic state to be stored. If a "0" logic state is to be stored, for example, the bit line BL may be set to a logical low (i.e., ground potential or VSS) and the complementary bit line BLB may be set to a logical high (i.e., power supply potential VDD). To write a "1" logic state, in contrast, the voltages of BL and BLB may be reversed. The word line WL corresponding to the particular memory cell 110 is then asserted by the row decoder 120 (FIG. 1) to turn on transfer NFETs X1 and X2. Because the write driver 165 is much stronger than the transistors in the memory cell 110, charging the bit lines BL and BLB and asserting the word line WL in this manner ultimately results in the voltages on the bit lines BL and BLB being transferred to the internal storage nodes Q and QB in the selected memory cell 110.

In contrast, to read data from the memory cell 110, the bit lines BL and BLB are first pre-charged by the write driver 165 to a logical high state, such as by connecting the bit lines to VDD, and then allowed to float. Asserting the corresponding word line WL, in turn, causes the logic state on the internal storage nodes Q and QB of the selected memory cell 110 to be transferred to the bit lines BL and BLB. The sense amplifier 162 is then used to determine whether bit line BL or bit line BLB has a higher potential and, correspondingly, which logic state was stored in the particular memory cell 110 being read.

The illustrative memory block 100 includes provisions for implementing a unique form of "power gating" in order to reduce standby leakage current while, at the same time, maintaining stability. To achieve this kind of power gating, the memory block 100 varies VSSC as a function of the memory block's mode (e.g., active and standby modes). As indicated earlier, for example, the memory block 100 adjusts VSSC to a voltage potential about equal to VSS when the memory block 100 is actively performing read and write operations and is in a first mode, which is defined as an "active" mode in this embodiment. In contrast, the memory block 100 raises VSSC to a voltage potential greater than VSS, such as, for example, to an intermediate voltage between VSS and VDD, when the memory block 100 is not being accessed and is in a second mode, which is defined as a "standby" mode in this embodiment (i.e., VSS<standby VSSC<VDD). The voltage level of VSSC can be used to control a bias voltage of the NFETs N1 and N2 in the cross-coupled inverters, thereby controlling a drive strength (e.g., gain, etc.) of the storage element in the memory cell 110. Ultimately, raising standby VSSC in this manner has the effect of reducing the voltage bias applied to the memory cells 110 in the memory block 100. With the reduced voltage bias, the leakage current of each of the memory cells 110 may be reduced in standby mode, and, correspondingly, the overall standby leakage current of the memory block 100 and the larger SRAM device may be substantially lowered.

Figure 3:
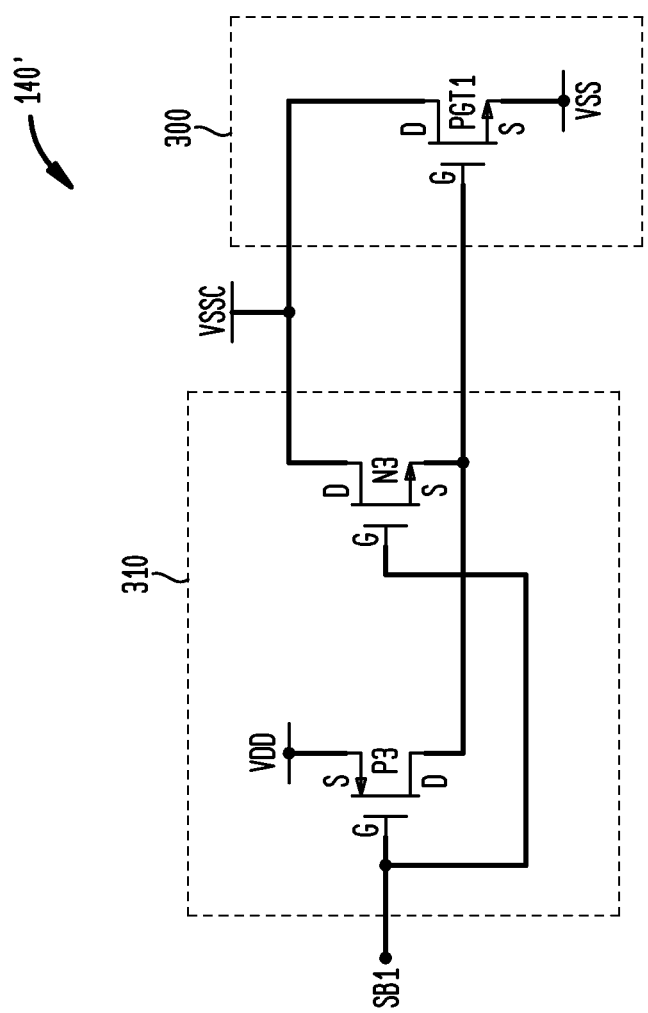
FIG. 3 shows a schematic diagram of at least a portion of a first power gating circuit that may reside in the FIG. 1 memory block, according to an embodiment of the invention.

In the present illustrative embodiment, modulation of VSSC within the memory block 100 is performed by the power gating circuit 140. FIG. 3 shows a schematic of at least a portion of a first illustrative power gating circuit 140' that may reside in the memory block 100, according to an embodiment of the invention. For ease of understanding, the power gating circuit 140' (i.e., power gating circuitry) may be separated into two portions: a power gating portion 300 and a control portion 310. Nevertheless, this conceptual separation of the elements is merely a means of clarifying the functions of the different portions 300, 310. When implemented in hardware, no corresponding physical separation between the portions 300, 310 may be present. For example, the two portions 300, 310 may be combined into a single circuit which is operative to perform at least the functions of the individual portions 300, 310.

As indicated in FIG. 3, the power gating portion 300 of the power gating circuit 140' comprises an NFET PGT1 (wherein the acronym "PGT" is used to represent a "power gating transistor" (PGT)). In this particular embodiment, the NFET PGT1 is connected between VSSC and VSS. Specifically, a source of the NFET PGT1 is adapted for connection with VSS and a drain of the NFET PGT1 is adapted for connection with VSSC. The control portion 310, in turn, comprises an NFET N3 and a PFET P3, which are both controlled by a control signal SB1. More particularly, a source of the PFET P3 is adapted for connection with VDD, a drain of the PFET P3 and a source of the NFET N3 are connected with a gate of the NFET PGT1, a drain of the NFET N3 is adapted for connection with VSSC, and a gate of the PFET P3 and the NFET N3 are adapted to receive the control signal SB1. The control signal SB1 is asserted (e.g., set to a logical high voltage level) and de-asserted (e.g., set to a logical low voltage level) by the control circuit 150 (FIG. 1).

Although shown in this embodiment as comprising a single NFET device, it is to be appreciated that the power gating transistor may, in other embodiments, be formed as a composite device comprising a plurality of transistors. For example, the power gating transistor may comprise two NFET devices (not explicitly shown) connected together in a cascade arrangement. This cascade arrangement is beneficial especially in high-voltage applications in which the voltage potential between VSS and the VSSC exceeds a maximum drain-to-source voltage specified for a single power gating transistor.

The control portion 310 of the power gating circuit 140' acts to configure the gate terminal of the NFET PGT1. As indicated above, the power gating circuit 140' functions to pull down VSSC to VSS when the memory block 100 is in an active mode (i.e., when access to one or more of the memory cells 110 is requested), and to allow VSSC to rise above VSS when the memory block 100 is in a standby mode (i.e., when access to the memory cells 110 is not requested). Accordingly, when the memory block 100 is in an active mode, the control circuit 150 de-asserts the control signal SB1, causing the PFET P3 to switch on and the NFET N3 to switch off. In this manner, the gate terminal of the NFET PGT1 is electrically tied to VDD, switching the NFET PGT1 on and causing the NFET PGT1 to electrically connect VSSC to VSS. In contrast, when the memory block 100 is in a standby mode, the control circuit 150 asserts the control signal SB1, causing the PFET P3 to switch off and the NFET N4 to switch on. This, in turn, acts to electrically connect the gate terminal of the NFET PGT1 to VSSC.

The connection of the gate terminal of the NFET PGT1 to VSSC acts to place the NFET PGT1 into what is commonly called a diode-connected transistor configuration. As will be appreciated by one skilled in the art, a diode-connected NFET that is turned on produces a drain current Ids that increases exponentially with the voltage on its gate and drain terminals, Vg and Vd, respectively (where, in this case, Vg=Vd=VSSC). In a standby mode, VSSC rises above VSS as a result of leakage current from the memory cells 110. When VSSC rises about a threshold voltage above VSS, the NFET PGT1 turns on and begins conducting current Ids which serves to pull VSSC back towards VSS. This characteristic of the diode-connected NFET PGT1 has the property of clamping VSSC at a voltage different than VSS. Accordingly, the diode-connected NFET PGT1 prevents VSSC from increasing without limit (i.e., floating). With the reduced voltage bias, the leakage current of each of the memory cells 110 is thereby reduced when the memory block 100 is in a standby mode compared to the leakage current that occurs when the memory block 100 is in an active mode.

Figure 4:
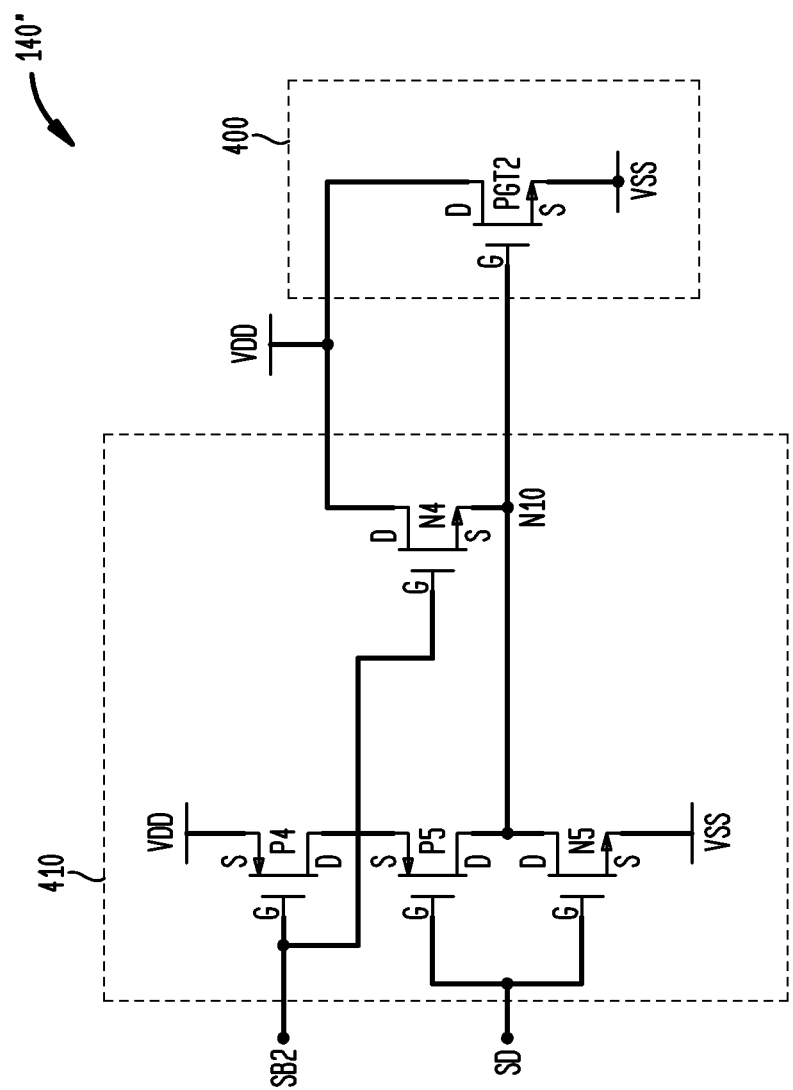
FIG. 4 shows a schematic diagram of at least a portion of a second power gating circuit that may reside in the FIG. 1 memory block, according to an embodiment of the invention.

Nevertheless, while the power gating circuit 140' allows VSSC to be electrically tied to VSS while the memory block 100 is in an active mode, and allows VSSC to be elevated to an intermediate value between VSS and VDD when the memory block 100 is in a standby mode, it may remain desirable to have the power gating circuit 140 (FIG. 1) be further capable of handling more than two modes. For example, in accordance with another embodiment, the power gating circuit 140 is operative to handle a third mode, which is defined as a "shutdown" mode in this embodiment. In such a shutdown mode, VSSC is allowed to rise even farther above VSS than it does in the standby mode, even to the point where data integrity is compromised. Leakage current may thereby be further diminished under those conditions wherein data integrity is not required. FIG. 4 shows a schematic diagram of at least a portion of a second illustrative power gating circuit 140" with such added capabilities, according to another embodiment of the invention.

With reference now to FIG. 4, as was the case for the power gating circuit 140' shown in FIG. 3, the power gating circuit 140" may be conceptually separated into two portions: a power gating portion 400 and a control portion 410 (although, as before, when implemented in hardware, no corresponding physical separation between the portions 400, 410 may be present). The power gating portion 400 of the power gating circuit 140" comprises an NFET PGT2 that is connected between VSSC and VSS in a manner similar to that shown in FIG. 3. The control portion 410, in turn, comprises an NFET N4, an NFET N5, a PFET P4, and a PFET P5, which are controlled by two control signals SB2 and SD supplied to the power gating circuit 140". More particularly, a drain of the NFET N4 is adapted for connection with VSSC, a source of the NFET N4 is connected with a gate of the NFET PGT2 at a node N10, a gate of the NFET N4 is adapted to receive the control signal SB2, a source of the PFET P4 is adapted for connection with VDD, a drain of the PFET P4 is connected with a source of the PFET P5, a gate of the PFET P4 is adapted to receive the control signal SB2, a drain of the PFET P5 is connected with a drain of the NFET N5 at the node N10, a source of the NFET N5 is adapted for connection with VSS, and gates of the PFET P5 and the NFET N5 are adapted to receive the control signal SD.

The control signals SB2 and SD are independently asserted and de-asserted by the control circuitry 150 (FIG. 1) as a function of the mode in which the memory block 100 is operating. In a manner similar to the power gating circuit 140' depicted in FIG. 3, the control portion 410 of the power gating circuit 140" ultimately acts to configure the gate terminal of the NFET PGT2. For example, when the memory block 100 is in an active mode, the control circuit 150 de-asserts the control signals SB2 and SD (e.g., logic low level), causing the PFETs P4 and P5 to switch on and the NFETs N4 and N5 to switch off. In this manner, the gate terminal of the NFET PGT2 is electrically tied to VDD, thereby causing the NFET PGT2 to switch on and to electrically connect VSSC to VSS. In contrast, when the memory block 100 is in a standby mode, the control circuit 150 asserts the control signal SB2 (e.g., logic high level) and de-asserts the control signal SD (e.g., logic low level). This causes the PFET P5 and the NFET N4 to switch on, and the PFET P4 and the NFET N5 to switch off. Such a configuration acts to electrically connect the gate terminal of the NFET PGT2 to VSSC through the NFET N4. The NFET PGT2 is thereby again placed in a diode-connected transistor configuration, where it acts to clamp VSSC at an intermediate voltage between VSS and VDD.

The power gating circuit 140" may achieve the third mode, namely a shutdown mode, by having the control circuit 150 assert the control signal SD (e.g., logic high level) and de-assert the control signal SB2 (e.g., logic low level). This combination turns on the NFET N5 and the PFET P4, and turns off the NFET N4 and the PFET P5, which acts to electrically connect the gate terminal of the NFET PGT2 to VSS. The NFET PGT2 is thereby caused to switch off. In this manner, the source potential line VSSC is left to electrically float. In response to the leakage current from the memory block, VSSC ultimately rises to a value even higher than that achieved during the standby mode (i.e., VSS<standby VSSC<shutdown VSSC<VDD). Leakage current may thereby be even further diminished utilizing the shutdown mode so long as data integrity is not vital.

Reference again to the illustrative power gating circuits 140', 140" shown in FIGS. 3 and 4, respectively, indicate that the power gating circuit 140 (FIG. 1) may be implemented in the memory block 100 with very few constituent elements. This provides the opportunity to realize such circuitry in an integrated circuit in a very area-efficient manner. Both power gating circuits 140', 140", for example, use a single respective NFET (i.e., PGT1 and PGT2) to control the level on VSSC for multiple modes. In the first power gating circuit 140', the NFET PGT1 is operative to both electrically connect VSSC to VSS while the memory block 100 is in a first mode, and to clamp VSSC at a voltage different from that of VSS when the memory block 100 is in a second mode. In the second power gating circuit 140", the NFET PGT2 is operative to modulate VSSC in the same manner as the NFET PGT1 in the power gating circuit 140', but is also operative to electrically float VSSC while the memory block 100 is in a third mode. At the same time, the associated control portions 310, 410 require only a few additional transistors. In the first illustrative power gating circuit 140', only two MISFETs are utilized for control. In the second illustrative power gating circuit 140", only four MISFETs are utilized.

As discussed above, embodiments of the invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in FIGS. 1-4, or portions thereof, may be part of an integrated circuit.

An integrated circuit in accordance with embodiments of the invention can be employed in essentially any application and/or electronic system in which a memory device (e.g., standalone or embedded) is utilized. Suitable systems for implementing techniques of the invention may include, but are not limited to, personal computers, communication systems, electronic instruments (e.g., automated test equipment (ATE)), interface networks, high-speed memory interfaces (e.g., DDR3, DDR4), etc. Systems incorporating such integrated circuits are also considered part of this invention.

It should again be emphasized that the above-described embodiments of the invention are intended to be illustrative only. Other embodiments may use different types and arrangements of elements for implementing the described functionality. As just one example, a skilled artisan will recognize that, in many circuit embodiments coming within the scope of the claimed invention, a PFET may be substituted for an NFET and vice versa with only minor modifications to the circuit and no significant changes in functionality. These numerous alternative embodiments within the scope of the appended claims will be apparent to one skilled in the art given the teachings herein.

Moreover, the features disclosed herein may be replaced by alternative features serving the same, equivalent, or similar purposes, unless expressly stated otherwise. Thus, unless expressly stated otherwise, each feature disclosed is one example only of a generic series of equivalent or similar features.

What is claimed is:

1. A memory device, comprising:
   a memory block, the memory block including at least one memory cell comprising a storage element electrically connected to a source potential line, a drive strength of the storage element being a function of a voltage level on the source potential line;
   a power gating transistor, the power gating transistor connected between the source potential line and a voltage source; and
   control circuitry coupled with the power gating transistor, the control circuitry operative to configure the power gating transistor to electrically connect the source potential line to the voltage source while the memory block is in a first mode, and to clamp the source potential line at a voltage different from that of the voltage source when the memory block is in a second mode.

2. The memory device of claim 1, wherein the memory cell is of a static type.

3. The memory device of claim 1, wherein the storage element comprises two cross-coupled inverters forming a latch.

4. The memory device of claim 3, wherein each of the cross-coupled inverters comprises a MISFET having a source terminal connected to the source potential line.

5. The memory device of claim 1, wherein the voltage source is fixed at a ground potential for the memory device.

6. The memory device of claim 1, wherein the power gating transistor comprises a MISFET.

7. The memory device of claim 1, wherein the memory block is accessed while in the first mode.

8. The memory device of claim 1, wherein the memory block is not accessed while in the second mode.

9. The memory device of claim 1, wherein the control circuitry is further operative to configure the power gating transistor to electrically float the source potential line while the memory block is in a third mode.

10. The memory device of claim 9, wherein the memory block is configured to exhibit a lower leakage current in the third mode than in the second mode.

11. The memory device of claim 9, wherein the memory block is not accessed while in the third mode.

12. The memory device of claim 1, wherein the control circuitry is controlled by one or more control signals.

13. The memory device of claim 1, wherein the control circuitry is separately operative to switch on the power gating transistor and to electrically connect a gate terminal of the power gating transistor to the source potential line.

14. The memory device of claim 13, wherein the control circuitry is further separately operative to turn off the power gating transistor.

15. The memory device of claim 1, wherein the control circuitry comprises two or fewer transistors.

16. The memory device of claim 1, wherein the control circuitry comprises four or fewer transistors.

17. A power gating circuit for use with a memory block, the memory block including at least one memory cell comprising a storage element electrically connected to a source potential line, a drive strength of the storage element being a function of a voltage level on the source potential line, the power gating circuit comprising:
   a power gating transistor, the power gating transistor connected between the source potential line and a voltage source; and
   control circuitry connected with the power gating transistor, the control circuitry operative to configure the power gating transistor to electrically connect the source potential line to the voltage source while the memory block is in a first mode, and to clamp the source potential line at a voltage different from that of the voltage source when the memory block is in a second mode.

18. The power gating circuit of claim 17, wherein the power gating circuit is implemented in an integrated circuit.

19. An integrated circuit comprising at least one memory device, the at least one memory device comprising:
   a memory block, the memory block including at least one memory cell comprising a storage element electrically connected to a source potential line, a drive strength of the storage element being a function of a voltage level on the source potential line;
   a power gating transistor, the power gating transistor connected between the source potential line and a voltage source; and
   control circuitry coupled with the power gating transistor, the control circuitry operative to configure the power gating transistor to electrically connect the source potential line to the voltage source while the memory block is in a first mode, and to clamp the source potential line at a voltage different from that of the voltage source when the memory block is in a second mode.

20. The integrated circuit of claim 19, wherein the at least one memory device comprises a static random access memory.

* * * * *